United States Patent
Li et al.

(10) Patent No.: US 8,766,646 B2
(45) Date of Patent: Jul. 1, 2014

(54) CALIBRATION METHOD AND APPARATUS FOR CLOCK SIGNAL AND ELECTRONIC DEVICE

(75) Inventors: Kuofeng Li, Hsinchu County (TW); Wen Pin Chu, Hsinchu (TW); Yueh-Yao Nain, Hsinchu (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 263 days.

(21) Appl. No.: 13/282,358

(22) Filed: Oct. 26, 2011

(65) Prior Publication Data

US 2012/0112804 A1     May 10, 2012

(30) Foreign Application Priority Data

Nov. 9, 2010    (TW) ................................ 99138458 A (51) Int. Cl.
     *G01R 35/00*      (2006.01)

(52) U.S. Cl.
     USPC ............................ 324/601; 327/151; 327/153

(58) Field of Classification Search
     USPC .................................... 324/76.39, 76.41, 601
     See application file for complete search history.

(56) References Cited

U.S. PATENT DOCUMENTS

| | | | |
|---|---|---|---|
| 5,740,129 A | 4/1998 | Frampton | |
| 5,796,312 A | 8/1998 | Hull et al. | |
| 6,304,517 B1 | 10/2001 | Ledfelt et al. | |
| 6,326,825 B1* | 12/2001 | Walley | 327/160 |
| 2007/0290763 A1* | 12/2007 | Partridge et al. | 331/154 |
| 2009/0002043 A1* | 1/2009 | Kris | 327/175 |
| 2009/0051444 A1* | 2/2009 | Inoue | 331/57 |
| 2010/0127739 A1* | 5/2010 | Ebuchi et al. | 327/148 |
| 2010/0225371 A1* | 9/2010 | Kim | 327/160 |
| 2011/0304487 A1* | 12/2011 | Anastasov et al. | 341/51 |

* cited by examiner

*Primary Examiner* — Huy Q Phan
*Assistant Examiner* — Dustin Dickinson
(74) *Attorney, Agent, or Firm* — Muncy, Geissler, Olds & Lowe, P.C.

(57) ABSTRACT

An embodiment of the invention provides a clock calibration method to calibrate an internal clock signal of a computer. The method comprises: receiving an external clock signal from an external clock source; generating a pulse signal with a first duration according to the external clock signal; counting the internal clock signal according to the pulse signal to get a first count value; and calibrating the internal clock according to the first count value.

16 Claims, 5 Drawing Sheets

FIG. 5

CALIBRATION METHOD AND APPARATUS FOR CLOCK SIGNAL AND ELECTRONIC DEVICE

CROSS REFERENCE TO RELATED APPLICATIONS

This application claims priority of Taiwan Patent Application No. 99138458, filed on Nov. 9, 2010, the entirety of which is incorporated by reference herein.

BACKGROUND OF THE INVENTION

1. Field of the Invention

The present invention relates to a calibration method and device, and in particular relates to a clock calibration method and device.

2. Description of the Related Art

When a computer has been idle for a predetermined amount of time or receives user instructions, the computer may enter a sleeping mode for saving power, and most elements of the computer temporarily stop working. The computer usually has two clock sources, one is an external clock source providing an accurate external clock signal and the other is an internal clock source providing an inaccurate but acceptable internal clock signal. When the computer is in a sleeping mode, the computer stops receiving the external clock signal and uses the internal clock signal. However, a timing signal generated according to an inaccurate internal clock signal may be inaccurate, and the actual time generated by the computer according to the clock signal may induce errors.

BRIEF SUMMARY OF THE INVENTION

An embodiment of the invention provides a clock calibration method for calibrating an internal clock signal of an electronic device. The method comprises: receiving an external clock signal from an external clock source; generating a pulse signal with a first duration according to the external clock signal; counting the internal signal to get a first count value according to the pulse signal, wherein a product of the first count value and a clock cycle of the internal clock signal is equal to the first duration; calibrating the internal clock signals according to the first count value.

Another embodiment of the invention provides a clock calibration device to calibrate an internal clock signal of an electronic device. The clock calibration device comprises a pulse signal generator, a clock calibration module and a controller. The pulse signal generator receives an external clock signal to generate a pulse signal corresponding a time duration. The clock calibration module receives the pulse signal and the internal clock signal to generate a first count value corresponding to the internal clock signal. The controller calibrates the internal clock signal according to the first count value.

Another embodiment of the invention provides an electronic device having a clock calibration device. The electronic device receives an external clock signal and an internal clock signal. The electronic device comprises a clock calibration device and an enable signal generation unit. The clock calibration device comprises a clock calibration module and a counting device. The clock calibration module receives a pulse signal and the internal clock signal to generate a first count value. The counting device receives the internal clock signal and the first count value to count the number of cycles of the internal clock signal to generate a second count value and outputs a trigger signals according to the first count value and the second count value. The enable signal generation unit generates an enable signals according to the trigger signal to enable a specific function of the electronic device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
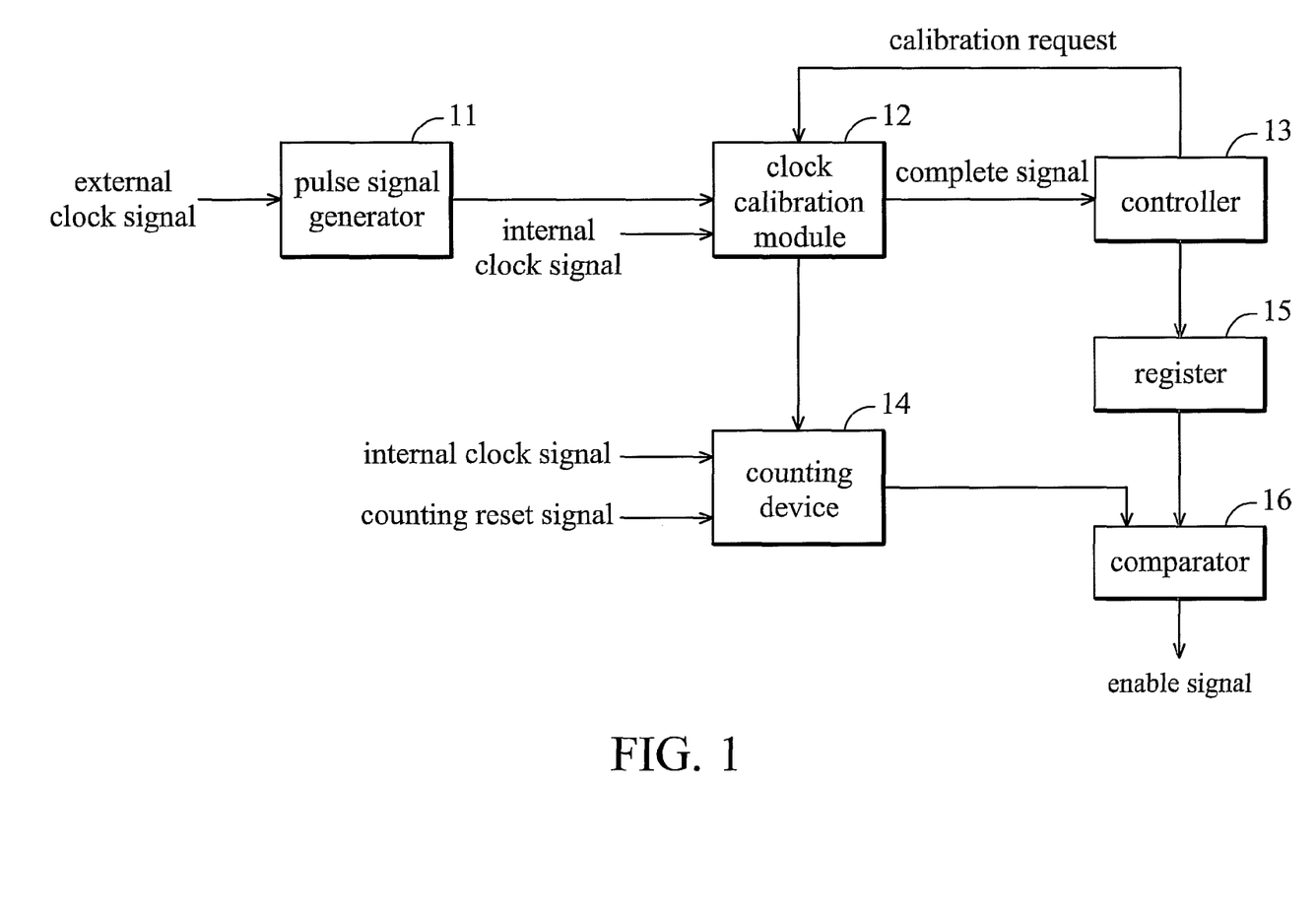
FIG. 1 is a schematic diagram of a clock calibration device according to an embodiment of the invention.

FIG. 1 is a schematic diagram of a clock calibration device according to an embodiment of the invention. The clock calibration device can be embedded in an electronic apparatus, such as a computer, a laptop, a smart phone and other similar apparatuses. The pulse signal generator 11 receives an external clock signal to generate a pulse signal with a first duration. In this embodiment, the external clock signal is generated by an external clock source and the accuracy of the external clock signal is higher than the accuracy of an internal clock signal of an internal clock source. When the electronic device enters a sleeping mode or a power-saving mode, most elements of the electronic device are turned off and the external clock source therefore stops working. In another situation, although the external source still works, but most elements of the electronic cannot receive the external clock signal from the external clock source because they are turned off. Therefore, the electronic device can use only the internal clock signal with lower accuracy. To ensure that the electronic apparatus works normally, the internal clock signal can be calibrated by the clock calibration device. The clock calibration device may calibrate the internal clock signal periodically or only before the electronic device enters the sleeping mode. In this embodiment, the controller 13 first sends a calibration request to a clock calibration module 12 and the internal clock signal is calibrated by the clock calibration module 12 upon receiving calibration request.

The clock calibration module 12 receives the internal clock signal and a pulse signal with a first duration generated by the pulse signal generator 11. The clock calibration module 12 determines the number of the clock cycles of the internal clock signal within the first duration. The clock calibration module 12 can be a counting device or comprise the counting device therein to count the number of clock cycles of the internal clock signal within the first duration and generates a first count value, wherein a product of the first count value and a time length of the clock cycle of the internal clock signal is equal to the first duration. The clock calibration module 12 may directly calculate the number of clock cycles of the internal clock signal according to the clock cycle of the internal clock signal and the first duration. The clock calibration module 12 transmits a first count value to the counting device 14 according to the number of the clock cycles of the internal clock signal. For example, a time length of the first duration is 200 milliseconds, and the clock calibration module 12 determines that 7000 clock cycles of the internal clock signal were counted in 200 milliseconds. Then, the clock calibration module 12 transmits the value, 7000, to the counting device 14.

After finishing the calibration, the clock calibration module 12 transmits a "complete signal" to the controller 13. In this embodiment, the electronic device will execute an action after entering the sleeping mode for a predetermined time duration or the electronic device has an alarm function which will be enabled after the predetermined time duration. The controller generates a register value according to the predetermined time duration, stores the register value in the register 15 and transmits the register value to the comparator 16. When the electronic device enters the sleeping mode, the counting device 14 first receives the counting reset signal to reset a count value of the counting device 14 to zero. The counting device 14 then counts the number of clock cycles of the internal clock signal to generate and transmit a second count value to the comparator 16. When the second count value is equal to the register value, the comparator 16 issues an enable signal to enable the predetermined function. In this embodiment, the comparator 16, the register 15 and the counting device 14 can be considered as an enable signal generation unit to generate the enable signal for enabling the predetermined function.

Figure 2:
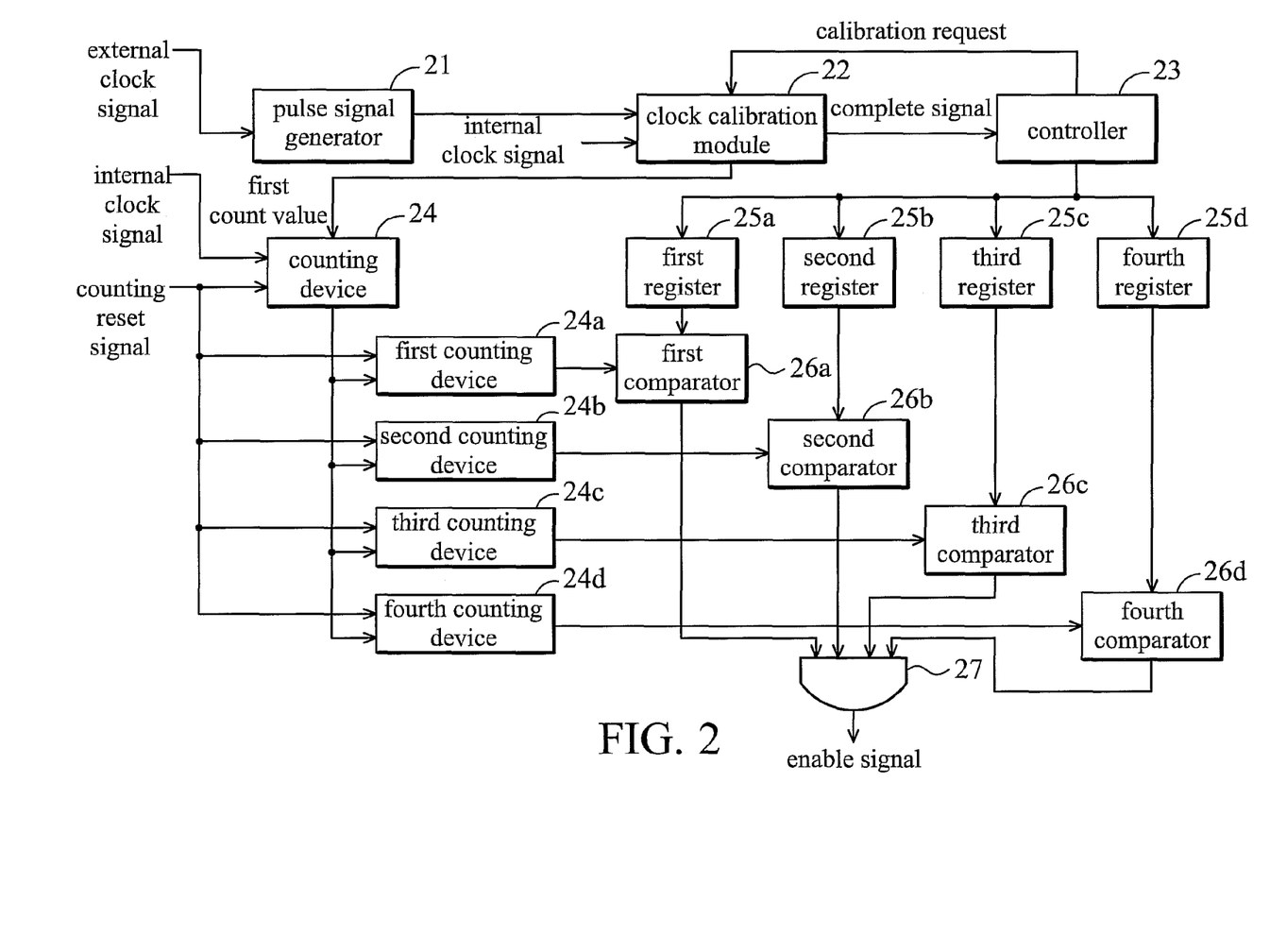
FIG. 2 is a schematic diagram of a clock calibration device according to another embodiment of the invention.

To better illustrate the innovation, please refer to FIG. 2. FIG. 2 is a schematic diagram of a clock calibration device according to another embodiment of the invention. The embodiment describes an electronic device that will enable a specific function, such as an alarm function, at a specific time. The controller 23 generates four register values according to the specific time. The device of FIG. 2 comprises four registers, a first register 25a, a second register 25b, a third register 25c and a fourth register 25d, respectively storing the register values corresponding to values of day, hour, minute and second of the specific time.

Since the electronic device cannot use the accurate external clock signal for the clock signal required by the real time signal, the electronic device therefore uses the internal clock signal for the clock signal required by the real time signal. To avoid errors due to the internal clock signal, the controller 23 sends a clock signal calibration request to the clock calibration module 22 when the electronic device receives the external clock signal, and the clock calibration module 22 calibrates the internal clock signal after receiving the clock signal calibration request. The controller 23 may also send the clock signal calibration request periodically to the clock calibration module 22 to calibrate the internal clock signal. In another situation, the controller 23 sends the clock signal calibration request to calibrate the internal clock signal only before the electronic device enters a sleeping mode or other predetermined mode.

The pulse signal generator 21 receives the external clock signal and generates a pulse signal with a predetermined duration. The clock calibration module 22 receives the pulse signal and the internal clock signal, and determines a number of clock cycles of the internal clock signal within the predetermined duration. The clock calibration module 22 may be implemented by a counter to count the number of clock cycles of the internal clock signal within the predetermined duration. The clock calibration module 22 may directly estimate the number of clock cycles of the internal clock signals according to the predetermined duration and a time length of the clock cycle of the internal clock signal. The clock calibration module 22 generates and transmits a first count value to the counting device 24 according to the number of clock cycles of the internal clock signal. For example, if the predetermined duration is 200 milliseconds, and the number of clock cycles of the internal clock signal is 7000, then, the clock calibration module 22 would transmit the first count value, 7000, to the counting device 24. The counting reset signal can reset the count values of the counting device 24, the fourth counting device 24d, the third counting device 24c, the second counting device 24b and the first counting device 24a.

The fourth counting device 24d, the third counting device 24c, the second counting device 24b and the first counting device 24a respectively generate the information corresponding to second, minute, hour and day. For example, the counting device 24 issues a trigger signal to the fourth counting device 24d, the third counting device 24c, the second counting device 24b and the first counting device 24a, at every 7000 clock cycles of the internal clock signal. In other words, the counting device 24 issues a trigger signal to the fourth counting device 24d, the third counting device 24c, the second counting device 24b and the first counting device 24a every 200 milliseconds. When the fourth counting device 24d counts to 5 trigger signals, the fourth counting device 24d increases its count value by 1. When the third counting device 24c counts to 300 trigger signals, the third counting device 24c increases its count value by 1. The operations of the second counting device 24b and the first counting device 24a are the same. The fourth counting device 24d, the third counting device 24c, the second counting device 24b and the first counting device 24a continuously transmit their count values respectively to the fourth comparator 26d, the third comparator 26c, the second comparator 26b and the first comparator 26a. In another embodiment, the fourth counting device 24d, the third counting device 24c, the second counting device 24b and the first counting device 24a only transmit the count values respectively to a corresponding comparator when the count value is changed.

In another embodiment of the invention, the counting device 24 may comprise a comparator and a register. The register stores a corresponding count value or register value, and the comparator compares the count value of the counting device 24 with the register value. If the count value is equal to the register value, the counting device 24 issues the trigger signal. In this embodiment, the register value is 7000, so the comparator compares the count value of the counting device 24 with the register value and when the count value of the counting device 24 is 7000, the counting device 24 issues the trigger signal. Furthermore, the fourth counting device 24d, the third counting device 24c, the second counting device 24b and the first counting device 24a may also comprise the corresponding register and comparator, and the operations thereof are similar to the operation of the counting device 24.

For example, if the electronic device is set to initiate a specific function after one day and twelve hours and thirty-two minutes and ten seconds, the register value of the first register 25a is set to be 1, the value of the second register 25b is set to be 12, the value of the third register 25c is set to be 32 and the value of the fourth register 25d is set to be 10. The fourth comparator 26d, the third comparator 26c, the second comparator 26b and the first comparator 26a respectively compares the corresponding register value with its count value and outputs a signal with the logic state 1 when the register value is equal to the count value. When the output signals of the four comparators are at the logic state 1, the AND gate 27 outputs the enable signal with logic state 1 to initiate the corresponding function of the electronic device.

In another embodiment, the counting device 24 is a 24-bits counter. The counting device 24 transmits a trigger signal to the fourth counting device 24d every 35000 clock cycles of the internal clock signal to increase the count value of the fourth counting device 24d by 1. The counting device 24 transmits a trigger signal to the third counting device 24c every 210000 clock cycles of the internal clock signal to increase the count value of the third counting device 24c by 1. The operation of the first counting devices 24a and 24b are similar to the previously described operations. According to the described mechanism, the design of the fourth counting device 24d, the third counting device 24c, the second counting device 24b and the first counting device 24a can be simplified.

Figure 3:
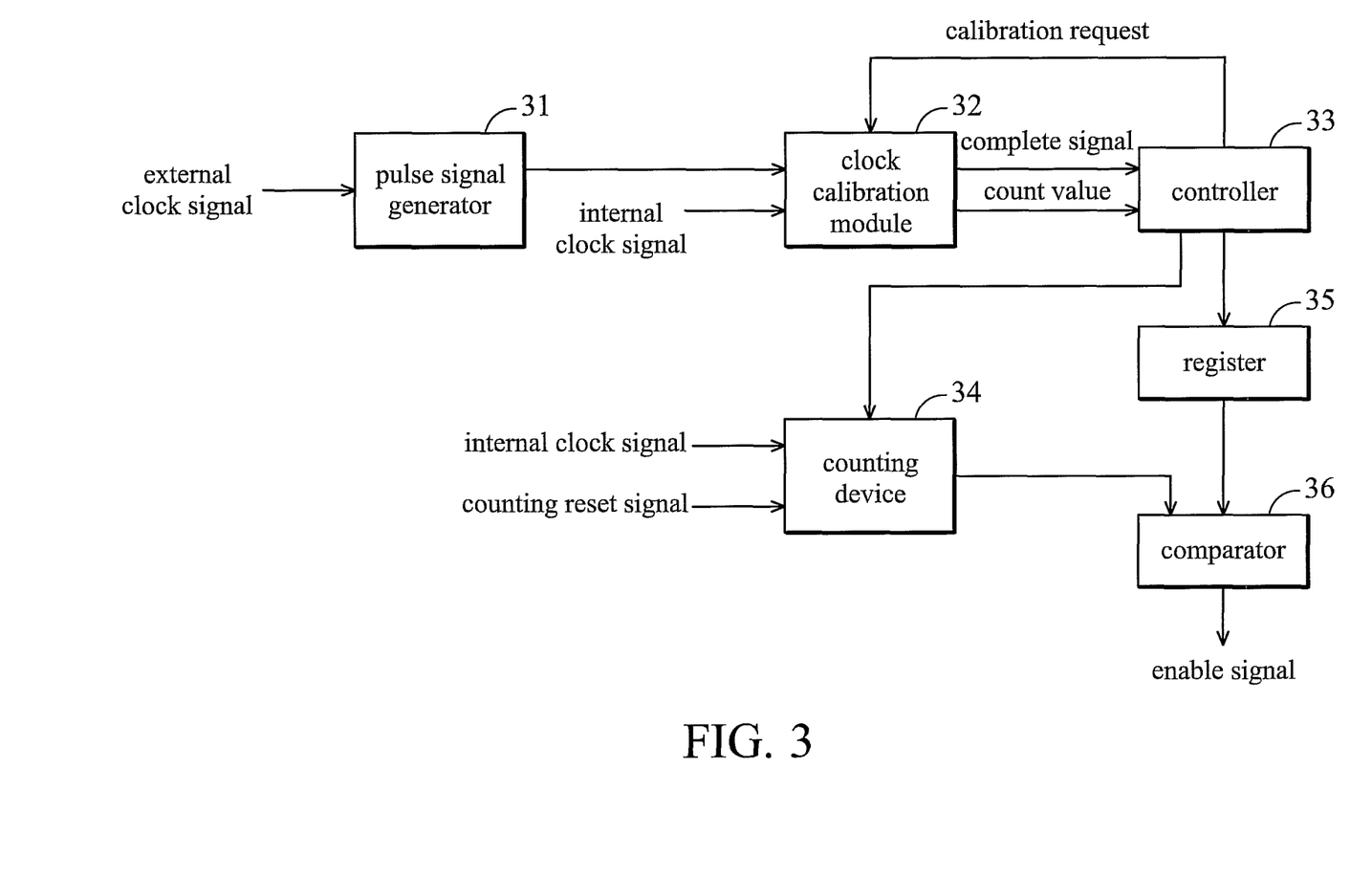
FIG. 3 is a schematic diagram of a clock calibration device according to another embodiment of the invention.

FIG. 3 is a schematic diagram of a clock calibration device according to another embodiment of the invention. In this embodiment, the external clock signal is generated by an external clock source, and the accuracy of the external clock signal is higher than the accuracy of the internal clock signal from an internal clock source of an electronic device. When the electronic device enters a sleeping mode or power-saving mode, most elements, including the external clock source, of the electronic device will be turned off or the electronic device cannot receive the external clock signal due to the elements of the electronic device being shut down. To ensure that the electronic device can work normally, the clock calibration device of the embodiment is applied to calibrate the internal clock signal. The electronic device can calibrate the internal clock signal periodically or only before the electronic device enters the sleeping mode. In this embodiment, the controller 33 first sends a calibration request to a clock calibration module 32 and after receiving the calibration request, the clock calibration module 32 calibrates the internal clock signal.

The clock calibration module 32 receives the internal clock signal and a pulse signal with a first duration generated by a pulse signal generator 31 to determine the number of clock cycles of the internal clock signal within the first duration. The clock calibration module 12 can be a counting device or comprise the counting device therein to count the number of clock cycles of the internal clock signal within the first duration to generate a first count value, wherein a product of the first count value and a time length of the clock cycle of the internal clock signal is equal to the first duration. The clock calibration module 32 may directly calculate the number of clock cycles of the internal clock signal according to the clock cycle of the internal clock signal and the first duration. The clock calibration module 32 transmits the first count value to the controller 33. For example, if the first duration is 200 milliseconds, and the clock calibration module 32 determines that 7000 clock cycles of the internal clock signal were counted within 200 milliseconds, then, the controller 33 transmits the value, 7000, to the counting device 34. In this embodiment, the counting device 34 is originally designed to receive the external clock signal and increases the count value of the counting device 34 every 200 milliseconds. The original design of the counting device 34 is that it counts to 1 when counting 8000 rising edges of the external clock signal. However, if the counting device 34 increases its count value by 1 when counting 8000 rising edges of the internal clock signal, it may cause a time error. Therefore, according to the described calibration mechanism, the electronic device can work normally. The user further can modify the counting device 34 via the controller 33 to let the counting device 34 to increase its count value by 1 following every 1 second or a predetermine time duration.

After the calibration is completed by the clock calibration module 32, a calibration "complete signal" is transmitted to the controller 33. In this embodiment, the electronic device will execute an operation, action or function after entering the sleeping mode following a predetermined amount of time, or the electronic device may have an alarm function which will be initiated after a predetermined amount of time. The controller 33 generates and stores a register value in the register 35 according to the predetermined amount of time, and transmits the register value to the comparator 36. When the electronic device enters the sleeping mode, the counting device 34 receives the counting reset signal to reset a count value of the counting device 34. Then, the counting device 34 counts the number of clock cycles of internal clock signal to generate and transmit a count value to the comparator 36. When the count value is equal to the register value, the comparator 36 issues an enable signal to initiate the predetermined function of the electronic device.

Figure 4:
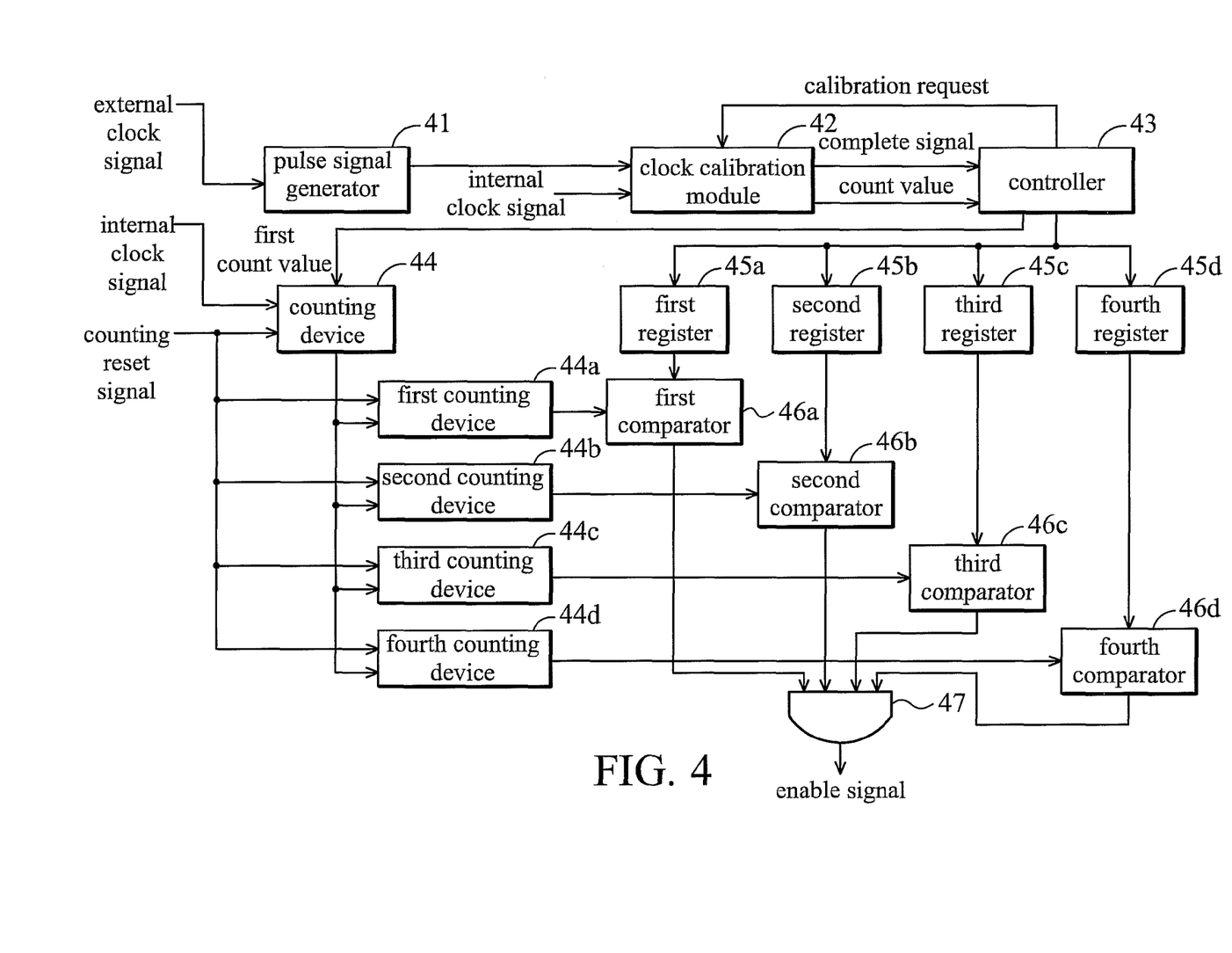
FIG. 4 is a schematic diagram of a clock calibration device according to another embodiment of the invention.

To better illustrate, please refer to FIG. 4. FIG. 4 is a schematic diagram of a clock calibration device according to another embodiment of the invention. The embodiment describes that an electronic device having the clock calibration device initiates a predetermined function, such as alarm function, at a predetermined time. The controller 43 generates four register values according to the predetermined time. The device of FIG. 4 comprises four registers, a first register 45a, a second register 45b, a third register 45c and a fourth register 45d, respectively storing the register values corresponding to values of day, hour, minute and second of the predetermined time. In this embodiment, the predetermined time can indicate an actual time or a remaining time which will be counted by a countdown timer.

When the electronic device cannot use the external clock signal as the clock signal required by a real time signal, the electronic device only can use the internal clock as the clock signal required by the real time signal; however, accuracy of the internal clock is lower than the accuracy of the external clock signal.

To avoid errors due to the internal clock signal, the controller 43 sends a clock signal calibration request to the clock calibration module 42 while the electronic device receives the external clock signal, and the clock calibration module 22 calibrates the internal clock signal after receiving the clock signal calibration request. In another embodiment, the controller 43 can be set to send the clock signal calibration request periodically to the clock calibration module 42 to calibrate the internal clock signal. In another embodiment, the controller 43 sends the clock signal calibration request only before the electronic device enters a sleeping mode or other predetermined mode, and the internal clock signal is then be calibrated by the external clock signal while the accurate external clock signal is available.

When calibrating the internal clock signal, a pulse signal with a predetermined duration is first determined by the pulse signal generator and the pulse signal is then used to calibrate the internal signal. The clock calibration module 42 receives the pulse signal and the internal clock signal to determine the number of clock cycles or the rising edges of the internal clock signal within the predetermined duration. The clock calibration module 42 may comprise a counter to count the number of clock cycles of the internal clock signal within the predetermined duration of the pulse signal. When counting the number of clock cycles, the clock calibration module 42 may only count the rising edges of the internal clock signal. In another embodiment, the clock calibration module 42 may directly estimate the number of clock cycles of the internal clock signals according to the predetermined duration of the clock cycle of the internal clock signal. The clock calibration module 42 generates and transmits a first count value to the counting device 44 according to the number of clock cycles of the internal clock signal. For example, if the predetermined duration is 200 milliseconds, and the number of clock cycles of the internal clock signal is 7000, then, the clock calibration module 42 would transmit the first count value, 7000, to the controller 43. The counting reset signal can be used to reset the count values of the counting device 44, the fourth counting device 44d, the third counting device 44c, the second counting device 44b and the first counting device 44a.

While the electronic receives the external clock signal, the counting device 44 is originally set to count the external clock signal and issues a trigger signal or increases its count value by 1 every 200 milliseconds. The counting device 44 is originally set to issue a trigger signal and increases its count value by 1 every time the counting device 44 counts 8000 rising edges of the external clock signal. When the clock signal input to the counting device 44 is changed from the external clock signal to the internal clock signal, time errors may occur if the counting device 44 issues a trigger signal and increases its count value by 1 every time the counting device 44 counts to 8000 rising edges of the internal clock signal. Therefore, according to the described calibration mechanism, the counting device 44 should issue the trigger signal and increase its count value by 1 every time the counting device 44 counts 7000 rising edges of the internal clock signal to avoid time errors and ensure that the counting device 44 will issue a trigger signal and increase its count value by 1 every 200 milliseconds. Furthermore, a user can modify the first count value transmitted to the counting device 44 to let the counting device 44 increase its count value by 1 and issue the trigger signal every 1 second or a predetermined amount of time period. For example, the controller 43 originally transmits the first count value, 7000, to the counting device 44 to let the counting device 44 issue a trigger signal or increase its count value by 1 every 200 milliseconds. The controller can then change the first count value from 7000 to 35000 to let the counting device 44 issue a trigger signal or increase its count value by 1 every 1 second.

In another embodiment, the counting device 44 may comprise a comparator and a register. The register stores a corresponding register value or count value and the comparator compare the count value of the counting device 44 with a corresponding register value. If the count value of the counting device 44 is equal to the corresponding register value, the counting device 44 issues the trigger signal. Furthermore, the fourth counting device 44d, the third counting device 44c, the second counting device 44b and the first counting device 44a may also comprise the corresponding register and comparator, and operations thereof would be similar to the operation of the counting device 44.

The fourth counting device 44d, the third counting device 44c, the second counting device 44b and the first counting device 44a respectively generates the information corresponding to second, minute, hour and day. For example, the counting device 44 issues a trigger signal to the fourth counting device 44d, the third counting device 44c, the second counting device 44b and the first counting device 44a at every 7000th count of the internal clock signal. In other words, the counting device 44 issues a trigger signal to the fourth counting device 44d, the third counting device 44c, the second counting device 44b and the first counting device 44a every 200 milliseconds. When the fourth counting device 24d counts to 5 trigger signals, the fourth counting device 24d increases its count value by 1. When the count value of the fourth counting device 44d is 59 and the fourth counting device 44d receives 5 trigger signals, the count value of the fourth counting device 44d will be reset to 0 and then re-count the number of clock cycles of internal clock signal. In other words, the variation range of the count value of the fourth counting device 44d is from 0 to 59. When the count value of the third counting device 44c is 59 and the third counting device 44c receives 5 trigger signals, the count value of the third counting device 44c will be reset to 0 and then re-count the number of clock cycles of internal clock signal. In other words, the variation range of the count value of the third counting device 44c is from 0 to 59. Similarly, the operations of the first counting device 44a and the second counting device 44b are similar to the previous description. The fourth counting device 44d, the third counting device 44c, the second counting device 44b and the first counting device 44a continuously transmit their count values respectively to the fourth comparator 46d, the third comparator 46c, the second comparator 46b and the first comparator 46a. In another embodiment, the fourth counting device 44d, the third counting device 44c, the second counting device 44b and the first counting device 44a only transmit the count values respectively to a corresponding comparator when the count value is changed.

For example, if the electronic device is set to initiate a specific function after one day twelve hours thirty-two minutes and ten seconds, the register value of the first register 45a is set to be 1, the value of the second register 45b is set to be 12, the value of the third register 45c is set to be 32 and the value of the fourth register 45d is set to be 10. The fourth comparator 46d, the third comparator 46c, the second comparator 46b and the first comparator 46a respectively compares the corresponding register value with its count value and outputs a signal with the logic state 1 when the register value is equal to the count value. When the output signals of the four comparators are all at the logic state 1, the AND gate 47 outputs the enable signal with logic state 1 to initiate the corresponding function of the electronic device. In this embodiment, the enable signal generator is implemented by an AND gate, but the invention is not limited thereto. Those skilled in the art can use logic gates, microcontrollers or other hardware or software to implement the enable signal generator.

Take the embodiment of FIG. 4 for example, the enable signal generator 47 may also be integrated with the first comparator 46a, the second comparator 46b, the third comparator 46c, the fourth comparator 46d, the first counting device 44a, the second counting device 44b, the third counting device 44c, the fourth counting device 44d, the first register 45a, the second register 45b, the third register 45c and the fourth register 45d to be regarded as another enable signal generator.

In another embodiment, the counting device 44 is a 24-bits counter that can output trigger signals respectively to the fourth counting device 44d, the third counting device 44c, the second counting device 44b and the first counting device 44a when the counting device 44 counts to different count values. Please refer the following description. The counting device 24 transmits a trigger signal to the fourth counting device 24d every 35000 clock cycles of the internal clock signal to increase the count value of the fourth counting device 24d by 1. The counting device 24 transmits a trigger signal to the third counting device 24c every 210000 clock cycles of the internal clock signal to increase the count value of the third counting device 24c by 1. The operations of the first counting devices 24a and 24b are similar to the previously described operations. According to the described mechanism, the design of the fourth counting device 24d, the third counting device 24c, the second counting device 24b and the first counting device 24a can be simplified.

Figure 5:
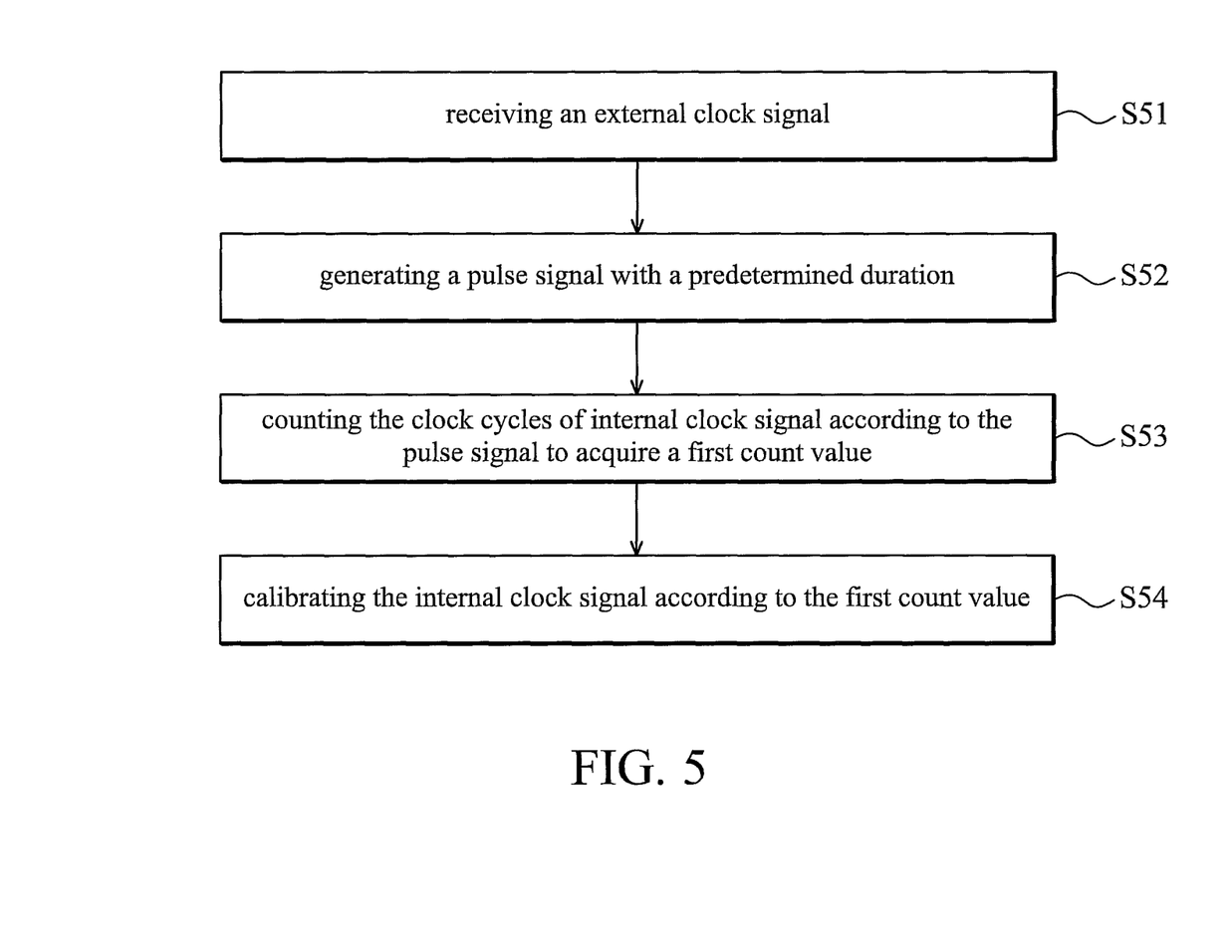
FIG. 5 is a flowchart of a clock calibration method according to an embodiment of the invention.

FIG. 5 is a flowchart of a clock calibration method according to an embodiment of the invention. In step S51, the clock calibration device receives an external clock signal from an external clock source. In step S52, a pulse signal with a predetermined duration is generated according to the external clock signal. In step S53, the clock calibration device counts the clock cycles of internal clock signal according to the pulse signal to acquire a first count value, wherein the product of the first count value and the clock cycle of the internal clock signal is equal to the predetermined duration. In this embodiment, the clock calibration device counts the rising edge of the internal clock signal, but the invention is not limited thereto. In the step S54, the clock calibration device uses the first count value to calibrate the internal clock signal. For the detailed calibration processes, reference may be made to the description of FIGS. 1-4 and are not described here for briefly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock calibration method for calibrating an internal clock signal of an electronic device, comprising:
   receiving an external clock signal from an external clock source;
   generating a pulse signal with a first duration according to the external clock signal;
   counting the internal clock signal to get a first count value according to the pulse signal, wherein a product of the first count value and a clock cycle of the internal clock signal is equal to the first duration;
   calibrating the internal clock signal according to the first count value;
   counting the internal signal to get a second count value;
   directly comparing the first count value with the second count value; and
   issuing a trigger signal when the second count value is equal to the first count value.

2. The method as claimed in claim 1, wherein the electronic device generates an enable signal according to the trigger signal to enable a specific function of the electronic device.

3. The method as claimed in claim 1, further comprising:
   estimating a second count value corresponding to a second duration, wherein a product of the second count value and a clock cycle of the internal clock signal is equal to the second duration;
   counting the internal signal to get a third count value; and
   issuing a trigger signal when the third count value is equal to the second count value.

4. The method as claimed in claim 3, wherein the electronic device further comprises a comparator receiving the second count value and the third count value to output the trigger signal when the third count value is equal to the second count value.

5. A clock calibration device to calibrate an internal clock signal of an electronic device, comprising:

a pulse signal generator receiving an external clock signal to generate a pulse signal with a time duration;
a clock calibration module receiving the pulse signal and the internal clock signal to generate a first count value, wherein a product of the first count value and a clock cycle of the internal clock signal is equal to the time duration;
a controller to calibrate the internal clock signal according to the first count value; and
a counting device receiving the first count value and the internal clock signal to count clock cycles of the internal clock signal to generate a second count value and outputting a trigger signal corresponding to the time duration by counting the clock cycles of internal clock signal according to the first count value, wherein the counting device comprises:
a comparator directly comparing the first count value with the second count value, and outputting the trigger signal when the first count value is equal to the second count value.

6. The device as claimed in claim 5, wherein the controller outputs a calibration request to the clock calibration module and when the clock calibration module receives the calibration request, the clock calibration module counts the clock cycles of internal clock signal to generate the first count value.

7. The device as claimed in claim 5, wherein the counting device further comprising a register for receiving and storing the first count value from the controller.

8. The device as claimed in claim 5, wherein the counting device further receives a counting reset signal to reset the counting device.

9. The device as claimed in claim 5, further comprising an enable signal generation unit to generate an enable signal to enable a specific function of the electronic device according to the trigger signal.

10. The device as claimed in claim 5, wherein the accuracy of the external clock signal is higher than the accuracy of the internal clock signal.

11. An electronic device, having a clock calibration device, receiving an external clock signal and an internal clock signal, comprising:
   the clock calibration device, comprising:
   a clock calibration module receiving a pulse signal with a time duration and the internal clock signal to generate a first count value, wherein a product of the first count value and a clock cycle of the internal clock signal is equal to the time duration; and
   a counting device receiving the internal clock signal and the first count value to count clock cycles of the internal clock signal to generate a second count value and outputting a trigger signals according to the first count value and the second count value, wherein the counting device further comprises:
   a comparator directly comparing the first count value with the second count value to output the trigger signal when the first count value is equal to the second count value; and
   an enable signal generation unit generating an enable signals according to the trigger signal to enable a specific function of the electronic device.

12. The electronic device as claimed in claim 11, the clock calibration device further comprising:
   a controller outputting a calibration request to the clock calibration module, wherein when the clock calibration module receives the calibration request, the clock calibration module counts the clock cycles of internal clock signal to generate the first count value.

13. The device as claimed in claim 11, wherein the counting device further comprising a register for receiving and storing the first count value from the clock calibration module.

14. The electronic device as claimed in claim 11, further comprising:
   a first counting device receiving and counting the trigger signal from the counting device to generate a third count value;
   a first register storing a first register value; and
   a first comparator receiving and comparing the third count value with the first register value to generate a comparison result and transmit it to the enable signal generation unit when the third count value is equal to the first register value, wherein the enable signal generation unit further generates the enable signal according to the comparison result to enable a specific function of the electronic device.

15. The electronic device as claimed in claim 11, wherein the counting device further receives a reset signal to reset the counting device.

16. The electronic device as claimed in claim 11, wherein the clock calibration device further comprises:
   a pulse signal generator to receive the external clock signal and generate the pulse signal with a predetermined duration according to the external clock signal.

* * * * *